US011908373B2

(12) United States Patent
Xu et al.

(10) Patent No.: US 11,908,373 B2
(45) Date of Patent: Feb. 20, 2024

(54) DISPLAY DRIVING CIRCUIT AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Zuzhao Xu, Wuhan (CN); Seungkyu Choi, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 643 days.

(21) Appl. No.: 17/047,387

(22) PCT Filed: May 26, 2020

(86) PCT No.: PCT/CN2020/092402
§ 371 (c)(1),
(2) Date: Oct. 13, 2020

(87) PCT Pub. No.: WO2021/196378
PCT Pub. Date: Oct. 7, 2021

(65) Prior Publication Data
US 2023/0129629 A1 Apr. 27, 2023

(30) Foreign Application Priority Data
Mar. 31, 2020 (CN) .......................... 202010241480.6

(51) Int. Cl.
*G09G 3/20* (2006.01)

(52) U.S. Cl.
CPC ..... *G09G 3/2092* (2013.01); *G09G 2310/0267* (2013.01); *G09G 2330/021* (2013.01)

(58) Field of Classification Search
CPC ......... G09G 3/2092; G09G 2310/0267; G09G 2330/021; G09G 2310/0286; G09G 3/20; G11C 19/28
See application file for complete search history.

(56) References Cited

U.S. PATENT DOCUMENTS

| 2007/0040792 A1* | 2/2007 | Kwag | .................. G09G 3/2092 345/100 |
| 2010/0128019 A1* | 5/2010 | Harada | ................ G09G 3/3611 345/212 |

(Continued)

FOREIGN PATENT DOCUMENTS

| CN | 1885379 A | 12/2006 |
| CN | 103680439 A | 3/2014 |

(Continued)

OTHER PUBLICATIONS

International Search Report in International application No. PCT/CN2020/092402, dated Dec. 30, 2020.

(Continued)

*Primary Examiner* — Jose R Soto Lopez
(74) *Attorney, Agent, or Firm* — PV IP PC; Wei Te Chung; Zhigang Ma (57) ABSTRACT

The present application provides a display driving circuit and a display device, wherein the display driving circuit comprises a plurality of driving units, each of the driving units comprises a plurality of stages of sub driving units, each of the driving units is electrically connected to one of independent triggering units, and the sub driving units in the driving units are electrically connected stage by stage; and the display device comprises the display driving circuit. A structure of the driving circuit can realize partitioned work (Continued)

of the driving circuit, and can reduce power consumption of the display device when the display driving circuit is applied in the display device.

19 Claims, 4 Drawing Sheets

(56) References Cited

U.S. PATENT DOCUMENTS

| | | | |
|---|---|---|---|
| 2020/0135113 A1* | 4/2020 | Baik | G09G 3/2007 |
| 2021/0020137 A1* | 1/2021 | Jang | G09G 3/3688 |
| 2022/0328013 A1* | 10/2022 | Roh | G09G 3/3266 |

FOREIGN PATENT DOCUMENTS

| | | |
|---|---|---|
| CN | 106023923 A | 10/2016 |
| CN | 104637431 B | 3/2019 |
| CN | 110675793 A | 1/2020 |

OTHER PUBLICATIONS

Written Opinion of the International Searching Authority in International application No. PCT/CN2020/092402, dated Dec. 30, 2020.

Chinese Office Action issued in corresponding Chinese Patent Application No. 202010241480.6 dated Mar. 2, 2021, pp. 1-8.

* cited by examiner

DISPLAY DRIVING CIRCUIT AND DISPLAY DEVICE

CROSS-REFERENCE TO RELATED APPLICATION

This application is a National Phase of PCT Patent Application No. PCT/CN2020/092402 having international filing data of May 26, 2020, which claims priority to Chinese Patent Application with the application No. 202010241480.6 and titled "Display driving circuit and display device", filed on Mar. 31, 2020 with the National Intellectual Property Administration, the disclosure of which is incorporated by reference in the present application in its entirety.

FIELD OF INVENTION

The present application relates to the field of display technology, and particularly to a display driving circuit and a display device.

DESCRIPTION OF PRIOR ART

Gate driver on array (GOA) technology is a kind of gate driving circuit technology commonly used in display devices, which has a simple manufacturing process and good application prospect. A function of GOA circuits mainly comprises: using high-level signals output from a previous row of gate to charge a capacitor in a shift register unit, so that a present row of gate lines output high-level signals, and then using a next row of gate lines to output high-level signals to reset.

Along with development of display technology, flexible folding panels have entered our lives and become a key technology for competition of panel manufacturers. At present, a folding mode of the flexible folding panels comprises horizontal half-fold or tri-fold, and vertical half-fold or tri-fold. A part of a display panel facing up after the display panel is folded becomes a main display area, and another part of the display panel facing down remains dark. But at present, the GOA circuits configured to drive the folding panel are the same as the GOA circuits configured to drive a non-folding panel. Even if the part of the display panel facing down after the display panel is folded does not display, its corresponding GOA circuit still remains in a working state, but driving signals of this part of the circuit will not be transmitted to the display panel, resulting in a waste of power consumption.

SUMMARY OF INVENTION

In the flexible folding display panel, the GOA circuit drives the display panel to display; however, regardless of which folding display mode the flexible folding display panel is in, the GOA circuit is in full circuit working state, resulting in increased power consumption and energy waste.

In order to solve the above technical problems, technical solutions provided in the present application are as follows:

The present application provides a display driving circuit, comprising:
  a plurality of driving units, each of the driving units comprises a plurality of stages of sub driving units;
  wherein each of the driving units is electrically connected to one of independent triggering units, the sub driving units in each of the driving units are electrically connected stage by stage, and each of the triggering units is configured to activate one of the driving units to provide signals to a display device.

In the display driving circuit provided in the embodiments of the present application, wherein the display device comprises three display areas, the display driving circuit comprises three of the driving units, and each of the driving units is configured to independently drive one of the display areas of the display device, respectively.

In the display driving circuit provided in the embodiments of the present application, wherein the display device comprises a first display area, a second display area, and a third display area, the display driving circuit comprises a first driving unit, a second driving unit, and a third driving unit, the first driving unit is configured to drive the first display area, the second driving unit is configured to drive the second display area, and the third driving unit is configured to drive the third display area.

In the display driving circuit provided in the embodiments of the present application, wherein a first stage sub driving unit of the first driving unit is electrically connected to a first triggering unit, a first stage sub driving unit of the second driving unit is electrically connected to a second triggering unit, and a first stage sub driving unit of the third driving unit is electrically connected to a third triggering unit.

In the display driving circuit provided in the embodiments of the present application, wherein each of the sub driving units comprises:
  a pull-up control unit electrically connected to a first clock signal input terminal, a first cascade signal input terminal, and a first node and configured to transmit signals input by the first cascade signal input terminal to the first node under control of signals input by the first clock signal input terminal;
  a pull-up unit electrically connected to the first node, a second clock signal input terminal, and a second node and configured to transmit signals input by the second clock signal input terminal to the second node under control of signals of the first node, wherein the second node is electrically connected to a cascade signal output terminal;
  a pull-down unit electrically connected to the second node, a third node, and a second low-voltage signal input terminal and configured to transmit signals input by the second low-voltage signal input terminal to the second node under control of signals of the third node;
  a pull-down control unit electrically connected to the first node, a second cascade signal input terminal, and a first low-voltage signal input terminal and configured to transmit signals input by the first low-voltage signal input terminal to the first node under control of signals input by the second cascade signal input terminal; and
  a pull-down maintaining unit electrically connected to the first node, the third node, a high-voltage signal input terminal, and the first low-voltage signal input terminal and configured to transmit signals input by the first low-voltage signal input terminal or signals input by the high-voltage signal input terminal to the third node under the control of the signals of the first node.

In the display driving circuit provided in the embodiments of the present application, wherein the pull-up unit comprises a capacitor and a first transistor, a first terminal of the capacitor is electrically connected to the second clock signal input terminal, and a second terminal of the capacitor is electrically connected to the first node; and
  a gate of the first transistor is electrically connected to the first node, a source of the first transistor is electrically connected to the second clock signal input terminal, and a drain of the first transistor is electrically connected to the second node.

In the display driving circuit provided in the embodiments of the present application, wherein the pull-up control unit comprises a second transistor, a gate of the second transistor is electrically connected to the first clock signal input terminal, a source of the second transistor is electrically connected to the cascade signal input terminal, and a drain of the second transistor is electrically connected to the first node.

In the display driving circuit provided in the embodiments of the present application, wherein the pull-down unit comprises a third transistor, a gate of the third transistor is electrically connected to the third node, a source of the third transistor is electrically connected to the second low-voltage signal input terminal, and a drain of the third transistor is electrically connected to the second node.

In the display driving circuit provided in the embodiments of the present application, wherein the pull-down control unit comprises a fourth transistor, a gate of the fourth transistor is electrically connected to the second cascade signal input terminal, a source of the fourth transistor is electrically connected to the first low-voltage signal input terminal, and a drain of the fourth transistor is electrically connected to the first node.

In the display driving circuit provided in the embodiments of the present application, wherein the pull-down maintaining unit comprises a fifth transistor, a sixth transistor, and a seventh transistor, a source of the fifth transistor and a source of the sixth transistor are electrically connected to the first low-voltage signal input terminal, a drain of the fifth transistor and a gate of the sixth transistor are electrically connected to the first node, a gate of the fifth transistor and a drain of the sixth transistor are electrically connected to the third node, a gate and a source of the seventh transistor are electrically connected to the high-voltage signal input terminal, and a drain of the seventh transistor is electrically connected to the third node.

In the display driving circuit provided in the embodiments of the present application, wherein a first cascade signal input terminal of a first stage sub driving unit is electrically connected to the triggering unit.

In the display driving circuit provided in the embodiments of the present application, wherein a first cascade signal input terminal of an nth stage sub driving unit is electrically connected to a cascade signal output terminal of an (n−1)th stage sub driving unit;
 a second cascade signal input terminal of the nth stage sub driving unit is electrically connected to a cascade signal output terminal of an (n+1)th stage sub driving unit; and
 wherein n is an integer greater than or equal to 2.

In the display driving circuit provided in the embodiments of the present application, wherein the first clock signal input terminal is electrically connected to a first clock signal line, and the second clock signal input terminal is electrically connected to a second clock signal line.

In the display driving circuit provided in the embodiments of the present application, wherein the first low-voltage signal input terminal is electrically connected to a first low-voltage signal line, the second low-voltage signal input terminal is electrically connected to a second low-voltage signal line, and the high-voltage signal input terminal is electrically connected to a high-voltage signal line.

In the display driving circuit provided in the embodiments of the present application, wherein only one of the driving units works alone when driving the display device.

In the display driving circuit provided in the embodiments of the present application, wherein any two or more of the driving units work simultaneously when driving the display device.

In the display driving circuit provided in the embodiments of the present application, wherein the display driving circuit is applied in a foldable display device, and each of the driving units corresponds to a foldable display area of the foldable display device.

The present application also provides a display device, comprising a display panel, wherein the display panel comprises a plurality of display areas, the display panel is driven to display by the display driving circuit of claim 1, and each of the display areas corresponds to one of the driving units.

In the display device provided in the embodiments of the present application, wherein only one of the driving units is driving one of the display areas to display alone, or any two or more of the driving units drive two or more of the display areas to display simultaneously when driving the display device.

The present application also provides a display device, comprising a display panel and a display driving circuit configured to drive the display panel to display, wherein the display panel comprises a first display area, a second display area, and a third display area, the display driving circuit comprises a first driving unit, a second driving unit, and a third driving unit, and each of the driving units is controlled independently by one of triggering units, respectively;
 the first driving unit is electrically connected to the first display area and configured to drive the first display area to display;
 the second driving unit is electrically connected to the second display area and configured to drive the second display area to display; and
 the third driving unit is electrically connected to the third display area and configured to drive the third display area to display.

The display driving circuit and the display device provided in the present application comprise a plurality of driving units, and each of the driving units comprises a plurality of sub driving units. By controlling each of the driving units with an independent triggering unit, a partitioned work of the driving circuit can be realized, and a power consumption of the display device can be reduced when the display driving circuit is applied in the display device.

BRIEF DESCRIPTION OF DRAWINGS

In order to explain the technical solutions in embodiments or the prior art more clearly, following description will give a brief introduction to figures needed in the embodiments or the prior art description. It is obvious that the figures in the following description only represent some embodiments of the present application. Those skilled in the art can also obtain other drawings according to these drawings without any creative work.

DETAILED DESCRIPTION OF PREFERRED EMBODIMENTS

The description of the following embodiments illustrates specific embodiments that the present application can implement with a reference to attached schematic diagrams. The directional terms mentioned in the present application, such as up, down, front, back, left, right, inside, outside, lateral, etc., are only the directions referring to the attached schematic diagrams. Therefore, the directional terms are used to explain and understand the present application, rather than to restrict the present application. In the figures, units with similar structure are represented by a same reference mark.

The embodiments of the present application provide a display driving circuit, comprising a plurality of driving units, each of the driving units comprises a plurality of stages of sub driving units. By controlling each of the driving units with an independent triggering unit, a partitioned work of the display driving circuit can be realized, and a power consumption of the display device can be reduced when the display driving circuit is applied in the display device.

Figure 1:
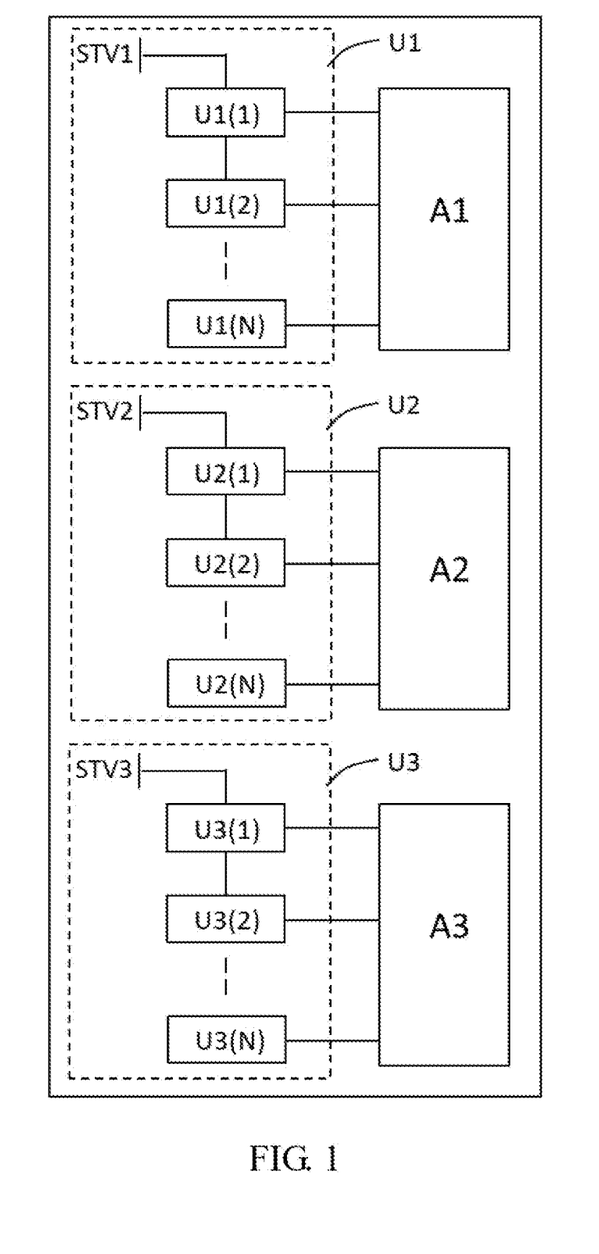
FIG. 1 is a schematic diagram of an overall cascade relationship of a display driving circuit provided in an embodiment of the present application.

As shown in FIG. 1, FIG. 1 is a schematic diagram of an overall cascade relationship of the display driving circuit provided in an embodiment of the present application. The display driving circuit comprises three driving units, namely, a first driving unit U1, a second driving unit U2, and a third driving unit U3. Wherein the first driving unit U1 is configured to drive a first display area A1 of the display device, the second driving unit U2 is configured to drive a second display area A2 of the display device, and the third driving unit U3 is configured to drive a third display area A3 of the display device. It should be noted that in the present embodiments, the display driving circuit is divided into three driving units, and the display device is divided into three display areas, but not limited to that. The display driving circuit can comprise more or fewer driving units, and the display device can also comprise more or fewer display areas.

The first driving unit U1 comprises a first stage sub driving unit U1(1), a second stage sub driving unit U1(2), . . . , and an nth stage sub driving unit U1(N); the second driving unit U2 comprises a first stage sub driving unit U2(1), a second stage sub driving unit U2(2), . . . , and an nth stage sub driving unit U2(N); the third driving unit U3 comprises a first stage sub driving unit U3(1), a second stage sub driving unit U3(2), . . . , and an nth stage sub driving unit U3(N); wherein N is a positive integer greater than or equal to 2. It should be noted that the numbers of sub driving units contained in the first driving unit U1, the second driving unit U2, and the third driving unit U3 can be the same or different.

Wherein, a first stage sub driving unit U1(1) of the first driving unit U1 is electrically connected to a first triggering unit STV1, the first triggering unit STV1 is configured to activate the first driving unit U1 to provide signals to the first display area A1 of the display device; a first stage sub driving unit U2(1) of the second driving unit U2 is electrically connected to a second triggering unit STV2, the second triggering unit STV2 is configured to activate the second driving unit U2 to provide signals to the second display area A2 of the display device; and a first stage sub driving unit U3(1) of the third driving unit U2 is electrically connected to a third triggering unit STV3, the third triggering unit STV3 is configured to activate the third driving unit U3 to provide signals to the third display area A3 of the display device.

Alternatively, the display device can be a three-fold flexible display device, wherein the first display area A1, the second display area A2, and the third display area A3 respectively correspond to three folding areas of the display device. When the display device is folded, a folding state sensing unit will automatically determine an upper display area to be displayed, and control the corresponding triggering units to provide triggering signals to the driving units through a control chip, so as to realize the partitioned work of the display driving circuit and reduce energy consumption of the display device. It should be noted that according to different folding states of the display device, only one of the driving units works alone in the display driving circuit, or any two or three of the driving units work simultaneously.

Alternatively, a circuit structure of each stages of the sub driving units in each of the driving units is the same. A structure of the sub driving units inside the first driving unit U1 will be described as an example.

Figure 2:
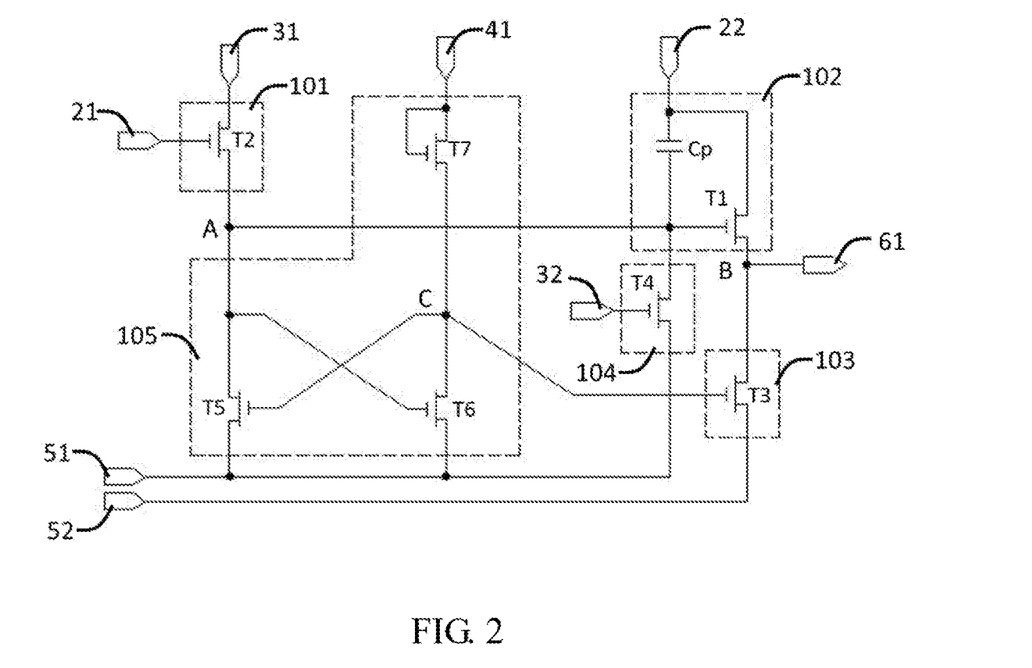
FIG. 2 is a schematic diagram of circuit structure of a sub driving unit in the display driving circuit provided in an embodiment of the present application.

As shown in FIG. 2, the sub driving unit comprises a pull-up control unit 101, a pull-up unit 102, a pull-down unit 103, a pull-down control unit 104, and a pull-down maintaining unit 105.

The pull-up control unit 101 is electrically connected to a first clock signal input terminal 21, a first cascade signal input terminal 31, and a first node A, respectively. The pull-up control unit 101 is configured to transmit signals input by the first cascade signal input terminal 31 to the first node A under control of signals input by the first clock signal input terminal 21.

Specifically, the pull-up control unit 101 comprises a second transistor T2, a gate of the second transistor T2 is electrically connected to the first clock signal input terminal 21, a source of the second transistor T2 is electrically connected to the cascade signal input terminal 31, and a drain of the second transistor T2 is electrically connected to the first node A.

It should be noted that, a transistor used in the display driving circuit provided in the embodiments of the present invention can be an n-type transistor or a p-type transistor. In order to understand the present invention easily, the n-type transistor is illustrated in the following embodiments as an example. It should be understood that, for the n-type transistor, when a gate of the transistor is at high level, a source and a drain of the transistor are on, and the transistor is on, otherwise the transistor is off; for the p-type transistor, when a gate of the transistor is at low level, a source and a drain of the transistor are on, and the transistor is on, otherwise the transistor is off.

The pull-up unit 102 is electrically connected to the first node A, a second clock signal input terminal 22, and a second node B respectively. The pull-up unit 102 is configured to transmit signals input by the second clock signal input terminal 22 to the second node B under control of signals of the first node A.

Specifically, the pull-up unit 102 comprises a capacitor Cp and a first transistor T1. A first terminal of the capacitor Cp is electrically connected to the second clock signal input terminal 22, a second terminal of the capacitor Cp is electrically connected to the first node A. The capacitor Cp is configured to couple voltages of the first node A and the second clock signal input terminal 22. A gate of the first transistor T1 is electrically connected to the first node A, a source of the first transistor T1 is electrically connected to the second clock signal input terminal 22, and a drain of the first transistor T1 is electrically connected to the second node B. The first transistor T1 is configured to transmit signals input by the second clock signal input terminal 22 to the second node B under control of voltage signals of the first node A.

Specifically, the second node B is electrically connected to a cascade signal output terminal 61. The cascade signal output terminal 61 is configured to provide scanning signals for a display unit of the display panel.

In the sub driving units of the present embodiments, two terminals of the capacitor Cp are respectively connected to the second clock signal input terminal 22 and the first node A, and the cascade signal output terminal 61 is set in parallel with the capacitor Cp through the first transistor T1. Therefore, signals of the second clock signal input terminal 22 transmitted via the first transistor T1 to the cascade signal output terminal 61 will not be lost by the capacitor Cp, which ensures that signals output by the cascade signal output terminal 61 have sufficient strength and stability.

The pull-down unit 103 is electrically connected to the second node B, a third node C, and a second low-voltage signal input terminal 52 respectively. The pull-down unit 103 is configured to transmit signals input by the second low-voltage signal input terminal 52 to the second node B under control of signals of the third node C, so as to pull down voltages of the second node B, so that the cascade signal output terminal 61 outputs low level.

Specifically, the pull-down unit 103 comprises a third transistor T3, a gate of the third transistor T3 is electrically connected to the third node C, a source of the third transistor T3 is electrically connected to the second low-voltage signal input terminal 52, and a drain of the third transistor T3 is electrically connected to the second node B.

The pull-down control unit 104 is electrically connected to the first node A, a second cascade signal input terminal 32, and a first low-voltage signal input terminal 51 respectively. The pull-down control unit 104 is configured to transmit signals input by the first low-voltage signal input terminal 51 to the first node A under control of signals input by the second cascade signal input terminal 32, so as to pull down voltages of the first node A.

Specifically, the pull-down control unit 104 comprises a fourth transistor T4, wherein a gate of the fourth transistor T4 is electrically connected to the second cascade signal input terminal 32, a source of the fourth transistor T4 is electrically connected to the first low-voltage signal input terminal 51, and a drain of the fourth transistor T4 is electrically connected to the first node A.

The pull-down maintaining unit 105 is electrically connected to the first node A, the third node C, a high-voltage signal input terminal 41, and the first low-voltage signal input terminal 51 respectively, the pull-down maintaining unit 105 is configured to transmit signals input by the first low-voltage signal input terminal 51 or signals input by the high-voltage signal input terminal 41 to the third node C under the control of the signals of the first node A, so as to pull down or pull up voltages of the third node C.

Specifically, the pull-down maintaining unit 105 comprises a fifth transistor T5, a sixth transistor T6, and a seventh transistor T7. Wherein a source of the fifth transistor T5 and a source of the sixth transistor T6 are electrically connected to the first low-voltage signal input terminal 51, a drain of the fifth transistor T5 and a gate of the sixth transistor T6 are electrically connected to the first node A, a gate of the fifth transistor T5 and a drain of the sixth transistor T6 are electrically connected to the third node C, a gate and a source of the seventh transistor T7 are electrically connected to the high-voltage signal input terminal 41, and a drain of the seventh transistor T7 is electrically connected to the third node C.

In the sub driving units provided in the present embodiments, the first low-voltage signal input terminal 51 pulls down voltages of the first node A, the second low-voltage signal input terminal 52 pulls down voltages of the second node B, so as to ensure that the cascade signal output terminal 61 is kept in a low-voltage state when there is no high-voltage signals output, and prevent an abnormality of signals output by the cascade signal output terminal 61 caused by a voltage fluctuation of the second node B.

The cascade relationship of the sub driving units in the first driving unit U1 will be described below.

Figure 3:
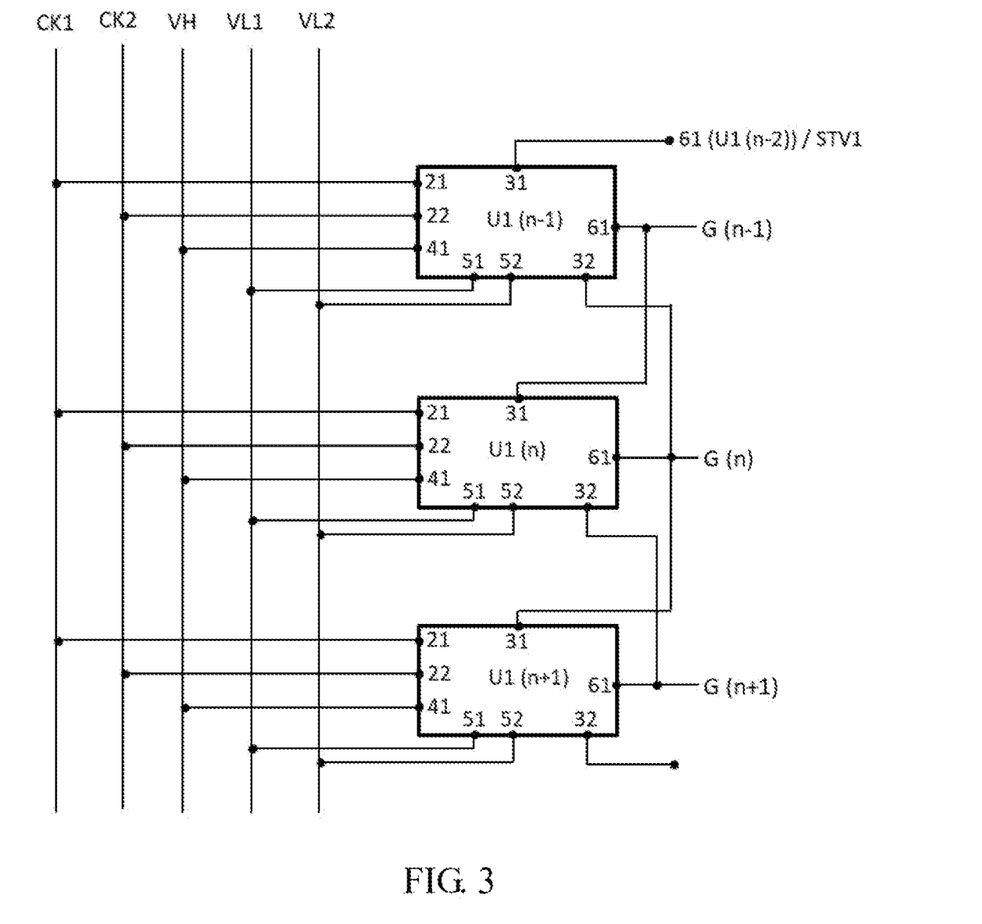
FIG. 3 is a schematic diagram of a cascade relationship of a first driving unit in the display driving circuit provided in an embodiment of the present application.

As shown in FIG. 3, the first cascade signal input terminal 31 of an nth stage sub driving unit U1($n$) is electrically connected to the cascade signal output terminal 61 of an (n−1)th stage sub driving unit U1($n$−1); the second cascade signal input terminal 32 of the nth stage sub driving unit U1($n$) is electrically connected to the cascade signal output terminal 61 of an (n+1)th stage sub driving unit U1($n$+1); wherein, n is an integer greater than or equal to 2, and less than N.

In particular, referring to FIG. 1 and FIG. 3, when n=2, the first cascade signal input terminal 31 of the first stage sub driving unit U1(1) is electrically connected to the first triggering unit STV1.

For any stage of sub driving units, there are following connections: the first clock signal input terminal 21 is electrically connected to a first clock signal line CK1, the first clock signal input terminal 21 is configured to transmit first clock signals to the first clock signal input terminal 21, and the second clock signal input terminal 22 is electrically connected to a second clock signal line CK2, the second clock signal input terminal 22 is configured to transmit second clock signals to the second clock signal input terminal 22; the first low-voltage signal input terminal 51 is electrically connected to a first low-voltage signal line VL1, the first low-voltage signal input terminal 51 is configured to transmit first low-voltage signals to the first low-voltage signal input terminal 51; the second low-voltage signal input terminal 52 is electrically connected to a second low-voltage signal line VL2, the second low-voltage signal input terminal 52 is configured to transmit second low-voltage signals to the second low-voltage signal input terminal 52; the high-voltage signal input terminal 41 is electrically connected to a high-voltage signal line VH, the high-voltage signal input terminal 41 is configured to transmit high-voltage signals to the high-voltage signal input terminal 41.

It should be noted that, the cascade signal output terminal 61 outputs cascade signals G, the cascade signals G can be configured to drive a display unit of the display panel.

Figure 4:
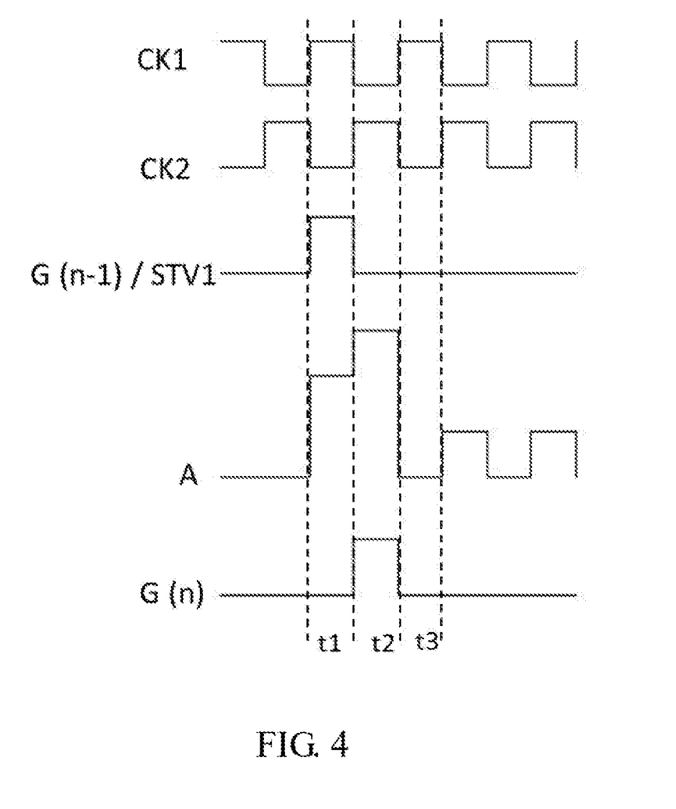
FIG. 4 is an input/output timing diagram of the first driving unit in the display driving circuit provided in an embodiment of the present application.

The input/output timing of the first driving unit U1 in the present embodiments will be analyzed in combination with FIGS. 2 to 4.

In the T1 time period, the first clock signal line CK1 is at high level, the second clock signal line CK2 is at low level, and the (n−1)th stage cascade signals G(n−1) is at high level. It should be noted that, when n=2, the (n−1)th stage cascade signals G(n−1) corresponds to triggering signals provided by the first triggering unit STV1. The second transistor T2 is turned on, and the (n−1)th stage cascade signals G(n−1) received by the first node A is at high level. The first transistor T1 and the sixth transistor T6 are turned on, the third node C pulled down by the first low-voltage signal line VL1 is at low level, the third transistor T3 is turned off, signals received from the second clock signal line CK2 by the second node B is at low level, and the nth stage cascade signals G(n) is at low level.

In the T2 time period, the first clock signal line CK1 is at low level, the second clock signal line CK2 is at high level, and the (n−1)th stage cascade signals G(n−1) or signals of the first triggering unit STV1 is at low level. The second transistor T2 is turned off, and under a voltage coupling effect of the capacitor Cp, a level of the first node A is further pulled up to a higher level. The first transistor T1 is further turned on, the third transistor T3 remains turned off, a high level of the second clock signal line CK2 is transmitted to the second node B, and the nth stage cascade signals G(n) is presented as high-level signals.

In the T3 time period, the first clock signal line CK1 is at high level, and the second clock signal line CK2 is at low level. At this time, with the transmission of the cascade signals G, the (n+1)th stage cascade signals G(n+1) is at high level. The fourth transistor T4 is turned on, and the first node A is pulled down to a low level by the first low-voltage signal line VL1. The first transistor T1 and the sixth transistor T6 are turned off, the third node C is pulled up to a high level by the high-voltage signal line VH, the third transistor T3 is turned on, the second node B is pulled down to a low level by the second low-voltage signal line VL2, and the nth stage cascade signals G(n) is presented as low-level signals.

It should be noted that, in the T2 time period, signals of the second clock signal line CK2 is directly transmitted to the cascade signal output terminal 61 through the first transistor T1, and the capacitor Cp will not cause loss to signals transmitted to the cascade signal output terminal 61, so as to ensure that the cascade signal output terminal 61 outputs stable cascade signals. In addition, in the T3 time period and the time period after T3, cascade signals output from the cascade signal output terminal 61 is always maintained at a low level by the second low-voltage signal line VL2, which can prevent an abnormal run out of the cascade signals output from the cascade signal output terminal 61 due to a signal fluctuation of the second clock signal line CK2.

To sum up, the display driving circuit provided in the embodiments of the present application comprises a plurality of driving units, each of the driving units comprises a plurality of stages of sub driving units. By controlling each of the driving units with an independent triggering unit, the partitioned work of the driving circuit can be realized, and the power consumption of the display device can be reduced when the display driving circuit is applied in the display device.

The embodiments of the present application also provide a display device, comprising a display panel, the display panel comprises a plurality of display areas, the display panel is driven to display through the display driving circuit provided in the embodiments of the present application, and each of the display areas corresponds to one of the driving unit.

Alternatively, the display device can be a three-fold flexible display device, comprising a first display area, a second display area, and a third display area, each of the display areas corresponds to a folding area of the display device, and each of the display areas is driven by one of the driving unit. When the display device is folded, the folding state sensing unit will automatically determine the upper display area to be displayed, and control the corresponding triggering units to provide triggering signals to the driving units through a control chip, so as to realize the partitioned work of the display driving circuit and reduce the energy consumption of the display device.

It should be noted that, although the present invention is disclosed as above in specific embodiments, the above embodiments are not used to limit the present invention. Those skilled in the art can make various changes and refinements within the spirit and scope of the present invention. Therefore, the scope of protection of the present invention is subject to the scope defined in the claims.

What is claimed is:

1. A display driving circuit, comprising:
   a plurality of driving units, each of the driving units comprises a plurality of stages of sub driving units;
   wherein each of the driving units is electrically connected to one of independent triggering units, the sub driving units in each of the driving units are electrically connected stage by stage, and each of the triggering units is configured to activate one of the driving units to provide signals to a display device;
   wherein each of the sub driving units comprises:
   a pull-up control unit electrically connected to a first clock signal input terminal, a first cascade signal input terminal, and a first node and configured to transmit signals input by the first cascade signal input terminal to the first node under control of signals input by the first clock signal input terminal;
   a pull-up unit electrically connected to the first node, a second clock signal input terminal, and a second node and configured to transmit signals input by the second clock signal input terminal to the second node under control of signals of the first node, wherein the second node is electrically connected to a cascade signal output terminal;
   a pull-down unit electrically connected to the second node, a third node, and a second low-voltage signal input terminal and configured to transmit signals input by the second low-voltage signal input terminal to the second node under control of signals of the third node;
   a pull-down control unit electrically connected to the first node, a second cascade signal input terminal, and a first low-voltage signal input terminal and configured to transmit signals input by the first low-voltage signal input terminal to the first node under control of signals input by the second cascade signal input terminal; and
   a pull-down maintaining unit electrically connected to the first node, the third node, a high-voltage signal input terminal, and the first low-voltage signal input terminal and configured to transmit signals input by the first low-voltage signal input terminal or signals input by the high-voltage signal input terminal to the third node under the control of the signals of the first node.

2. The display driving circuit of claim 1, wherein the display device comprises three display areas, the display driving circuit comprises three of the driving units, and each of the driving units is configured to independently drive one of the display areas of the display device, respectively.

3. The display driving circuit of claim 2, wherein the display device comprises a first display area, a second display area, and a third display area, the display driving circuit comprises a first driving unit, a second driving unit, and a third driving unit, the first driving unit is configured to drive the first display area, the second driving unit is configured to drive the second display area, and the third driving unit is configured to drive the third display area.

4. The display driving circuit of claim 3, wherein a first stage sub driving unit of the first driving unit is electrically connected to a first triggering unit, a first stage sub driving unit of the second driving unit is electrically connected to a second triggering unit, and a first stage sub driving unit of the third driving unit is electrically connected to a third triggering unit.

5. The display driving circuit of claim 1, wherein the pull-up unit comprises a capacitor and a first transistor, a first terminal of the capacitor is electrically connected to the second clock signal input terminal, and a second terminal of the capacitor is electrically connected to the first node; and a gate of the first transistor is electrically connected to the first node, a source of the first transistor is electrically connected to the second clock signal input terminal, and a drain of the first transistor is electrically connected to the second node.

6. The display driving circuit of claim 1, wherein the pull-up control unit comprises a second transistor, a gate of the second transistor is electrically connected to the first clock signal input terminal, a source of the second transistor is electrically connected to the cascade signal input terminal, and a drain of the second transistor is electrically connected to the first node.

7. The display driving circuit of claim 1, wherein the pull-down unit comprises a third transistor, a gate of the third transistor is electrically connected to the third node, a source of the third transistor is electrically connected to the second low-voltage signal input terminal, and a drain of the third transistor is electrically connected to the second node.

8. The display driving circuit of claim 1, wherein the pull-down control unit comprises a fourth transistor, a gate of the fourth transistor is electrically connected to the second cascade signal input terminal, a source of the fourth transistor is electrically connected to the first low-voltage signal input terminal, and a drain of the fourth transistor is electrically connected to the first node.

9. The display driving circuit of claim 1, wherein the pull-down maintaining unit comprises a fifth transistor, a sixth transistor, and a seventh transistor, a source of the fifth transistor and a source of the sixth transistor are electrically connected to the first low-voltage signal input terminal, a drain of the fifth transistor and a gate of the sixth transistor are electrically connected to the first node, a gate of the fifth transistor and a drain of the sixth transistor are electrically connected to the third node, a gate and a source of the seventh transistor are electrically connected to the high-voltage signal input terminal, and a drain of the seventh transistor is electrically connected to the third node.

10. The display driving circuit of claim 1, wherein a first cascade signal input terminal of a first stage sub driving unit is electrically connected to the triggering unit.

11. The display driving circuit of claim 10, wherein a first cascade signal input terminal of an nth stage sub driving unit is electrically connected to a cascade signal output terminal of an (n−1)th stage sub driving unit;

a second cascade signal input terminal of the nth stage sub driving unit is electrically connected to a cascade signal output terminal of an (n+1)th stage sub driving unit; and wherein n is an integer greater than or equal to 2.

12. The display driving circuit of claim 11, wherein the first clock signal input terminal is electrically connected to a first clock signal line, and the second clock signal input terminal is electrically connected to a second clock signal line.

13. The display driving circuit of claim 12, wherein the first low-voltage signal input terminal is electrically connected to a first low-voltage signal line, the second low-voltage signal input terminal is electrically connected to a second low-voltage signal line, and the high-voltage signal input terminal is electrically connected to a high-voltage signal line.

14. The display driving circuit of claim 1, wherein only one of the driving units works alone when driving the display device.

15. The display driving circuit of claim 1, wherein any two or more of the driving units work simultaneously when driving the display device.

16. The display driving circuit of claim 1, wherein the display driving circuit is applied in a foldable display device, and each of the driving units corresponds to a foldable display area of the foldable display device.

17. A display device, comprising a display panel, wherein the display panel comprises a plurality of display areas, the display panel is driven to display by the display driving circuit of claim 1, and each of the display areas corresponds to one of the driving units.

18. The display device of claim 17, wherein only one of the driving units is driving one of the display areas to display alone, or any two or more of the driving units drive two or more of the display areas to display simultaneously when driving the display device.

19. A display device, comprising a display panel and a display driving circuit configured to drive the display panel to display, wherein the display panel comprises a first display area, a second display area, and a third display area, the display driving circuit comprises a first driving unit, a second driving unit, and a third driving unit, and each of the driving units is controlled independently by one of triggering units, respectively;

the first driving unit is electrically connected to the first display area and configured to drive the first display area to display;

the second driving unit is electrically connected to the second display area and configured to drive the second display area to display; and the third driving unit is electrically connected to the third display area and configured to drive the third display area to display;

wherein each of the sub driving units comprises:

a pull-up control unit electrically connected to a first clock signal input terminal, a first cascade signal input terminal, and a first node and configured to transmit signals input by the first cascade signal input terminal to the first node under control of signals input by the first clock signal input terminal;

a pull-up unit electrically connected to the first node, a second clock signal input terminal, and a second node and configured to transmit signals input by the second clock signal input terminal to the second node under control of signals of the first node, wherein the second node is electrically connected to a cascade signal output terminal;

a pull-down unit electrically connected to the second node, a third node, and a second low-voltage signal input terminal and configured to transmit signals input by the second low-voltage signal input terminal to the second node under control of signals of the third node;

a pull-down control unit electrically connected to the first node, a second cascade signal input terminal, and a first low-voltage signal input terminal and configured to transmit signals input by the first low-voltage signal input terminal to the first node under control of signals input by the second cascade signal input terminal; and a pull-down maintaining unit electrically connected to the first node, the third node, a high-voltage signal input terminal, and the first low-voltage input terminal and configured to transmit signals input by the first low-voltage signal input terminal or signals input by the high-voltage signal input terminal to the third node under the control of the signals of the first node.

* * * * *